(12) United States Patent
Ichikawa et al.

(10) Patent No.: US 9,986,191 B2
(45) Date of Patent: May 29, 2018

(54) IMAGE CAPTURING APPARATUS AND IMAGE CAPTURING SYSTEM

(71) Applicant: CANON KABUSHIKI KAISHA, Tokyo (JP)

(72) Inventors: Takeshi Ichikawa, Hachioji (JP); Masahiro Kobayashi, Tokyo (JP); Yusuke Onuki, Fujisawa (JP); Toru Koizumi, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days. days.

(21) Appl. No.: 15/181,670

(22) Filed: Jun. 14, 2016

(65) Prior Publication Data
US 2016/0286149 A1 Sep. 29, 2016

Related U.S. Application Data

(63) Continuation of application No. 14/645,295, filed on Mar. 11, 2015, now Pat. No. 9,392,195.

(30) Foreign Application Priority Data

Mar. 14, 2014 (JP) .................................. 2014-052328

(51) Int. Cl.
*H04N 3/14* (2006.01)
*H04N 5/335* (2011.01)
(Continued)

(52) U.S. Cl.
CPC ....... *H04N 5/378* (2013.01); *H01L 27/14609* (2013.01); *H01L 27/14623* (2013.01);
(Continued)

(58) Field of Classification Search
CPC ............ H04N 5/3532; H04N 5/35581; H04N 5/3559; H04N 5/35545; H04N 5/37457;
(Continued)

(56) References Cited

U.S. PATENT DOCUMENTS 6,791,612 B1* 9/2004 Hwang ................... H04N 3/155
257/291
7,345,701 B2* 3/2008 Park ....................... H04N 9/045
348/222.1
(Continued)

FOREIGN PATENT DOCUMENTS

CN 101981918 A 2/2011
CN 102017150 A 4/2011
(Continued)

*Primary Examiner* — Chia-Wei A Chen
(74) *Attorney, Agent, or Firm* — Canon U.S.A., Inc. IP Division

(57) ABSTRACT

An image capturing apparatus performs a global electronic shutter operation in which a plurality of pixels are exposed during the same exposure period. In a first period, charge is accumulated by a photoelectric conversion unit. In a second period, accumulation units of a plurality of pixels accumulate charge. A ratio of saturation charge quantity of the photoelectric conversion unit to saturation charge quantity of the accumulation unit has a certain relationship with a ratio of a length of the first period to the sum of the length of the first period and the length of the second period.

21 Claims, 14 Drawing Sheets

(51) Int. Cl.
  *H04N 5/225* (2006.01)
  *H04N 5/378* (2011.01)
  *H04N 5/353* (2011.01)
  *H04N 5/355* (2011.01)
  *H01L 27/146* (2006.01)
  *H04N 5/376* (2011.01)

(52) U.S. Cl.
  CPC .. *H01L 27/14643* (2013.01); *H01L 27/14656* (2013.01); *H04N 5/3532* (2013.01); *H04N 5/35581* (2013.01); *H04N 5/3765* (2013.01)

(58) Field of Classification Search
  CPC ......... H01L 27/14609; H01L 27/14625; H01L 27/14656
  See application file for complete search history.

(56) References Cited

U.S. PATENT DOCUMENTS

| | | | | |
|---|---|---|---|---|
| 8,654,246 | B2* | 2/2014 | Kanamori | G06T 1/00 348/222.1 |
| 8,767,080 | B2* | 7/2014 | Mowry | G03B 17/00 348/154 |
| 8,791,401 | B2* | 7/2014 | Barbier | H04N 5/335 250/208.1 |
| 2004/0051801 | A1* | 3/2004 | Iizuka | H01L 27/14609 348/294 |
| 2007/0052811 | A1* | 3/2007 | Suzuki | H04N 3/1562 348/222.1 |
| 2007/0131991 | A1* | 6/2007 | Sugawa | H01L 27/14603 257/292 |
| 2008/0237446 | A1* | 10/2008 | Oshikubo | H01L 27/14603 250/208.1 |
| 2009/0045319 | A1* | 2/2009 | Sugawa | H01L 27/14609 250/208.1 |
| 2009/0079844 | A1* | 3/2009 | Suzuki | G03B 13/36 348/222.1 |
| 2011/0013064 | A1* | 1/2011 | Lahav | H04N 5/335 348/296 |
| 2011/0032403 | A1* | 2/2011 | Mabuchi | H04N 5/35581 348/296 |
| 2011/0211103 | A1* | 9/2011 | Sakano | H04N 5/37452 348/308 |
| 2013/0194472 | A1* | 8/2013 | Takeda | H04N 5/374 348/308 |
| 2013/0200479 | A1* | 8/2013 | Sakano | H01L 31/0216 257/435 |
| 2013/0214371 | A1* | 8/2013 | Asatsuma | H01L 31/02325 257/432 |
| 2014/0054445 | A1* | 2/2014 | Kikuchi | H01L 27/146 250/208.1 |
| 2014/0084143 | A1* | 3/2014 | Sakano | H01L 27/14609 250/208.1 |
| 2015/0163437 | A1* | 6/2015 | Nishizawa | H04N 5/378 348/296 |

FOREIGN PATENT DOCUMENTS

| | | |
|---|---|---|
| CN | 102547168 A | 7/2012 |
| CN | 102714700 A | 10/2012 |
| JP | 2000-050163 A | 2/2000 |

\* cited by examiner

IMAGE CAPTURING APPARATUS AND IMAGE CAPTURING SYSTEM

CROSS REFERENCE

The current application claims the benefit of the non-provisional application U.S. Ser. No. 14/645,295 filed on Mar. 11, 2015, which claims the benefit of Japanese patent application JP2014-052328, filed Mar. 14, 2014, which are hereby incorporated by reference herein in their entirety.

BACKGROUND

Technical Field

The present disclosure relates to an image capturing apparatus and an image capturing system.

Description of the Related Art

Use of global electronic shutters in CMOS image sensors is proposed recently. An image capturing apparatus described in Japanese Patent Laid-Open No. 2004-111590 has an effect that an object image is not distorted even when capturing images of a quickly moving object.

SUMMARY

An embodiment according to the present disclosure provides an image capturing apparatus. The image capturing apparatus includes a plurality of pixels. Each of the plurality of pixels includes a photoelectric conversion unit configured to generate and accumulate charge in response incident light, an accumulation unit configured to accumulate the charge, an amplifier unit configured to output a signal based on the charge, a first transfer switch configured to transfer the charge to the accumulation unit from the photoelectric conversion unit, and a second transfer switch configured to transfer the charge to the amplifier unit from the accumulation unit. The image capturing apparatus includes an output line to which signals from the amplifier units of the plurality of pixels are output. At a first time point, the photoelectric conversion units of the plurality of pixels start accumulation of the charge. The first transfer switches of the plurality of pixels are kept OFF from the first time point to a second time point, and the photoelectric conversion units of the plurality of pixels accumulate charge generated in a first period from the first time point to the second time point. In a second period from the second time point to a third time, the accumulation units of the plurality of pixels accumulate charge generated by the photoelectric conversion units in the first period from the first time point to the second time point, and charge generated by the photoelectric conversion units in the second period. At the third time, the first transfer switches of the plurality of pixels are controlled from ON to OFF. Saturation charge quantity $A_1$ ("A" followed by a suffix of "1") of the photoelectric conversion unit, saturation charge quantity $A_2$ ("A" followed by a suffix of "2") of the accumulation unit, the first period $P_1$ ("P" followed by a suffix of "1"), and the second period $P_2$ ("P" followed by a suffix of "2") satisfy a certain relationship.

Further features of the present disclosure will become apparent from the following description of exemplary embodiments with reference to the attached drawings.

DESCRIPTION OF THE EMBODIMENTS

Figure 1:
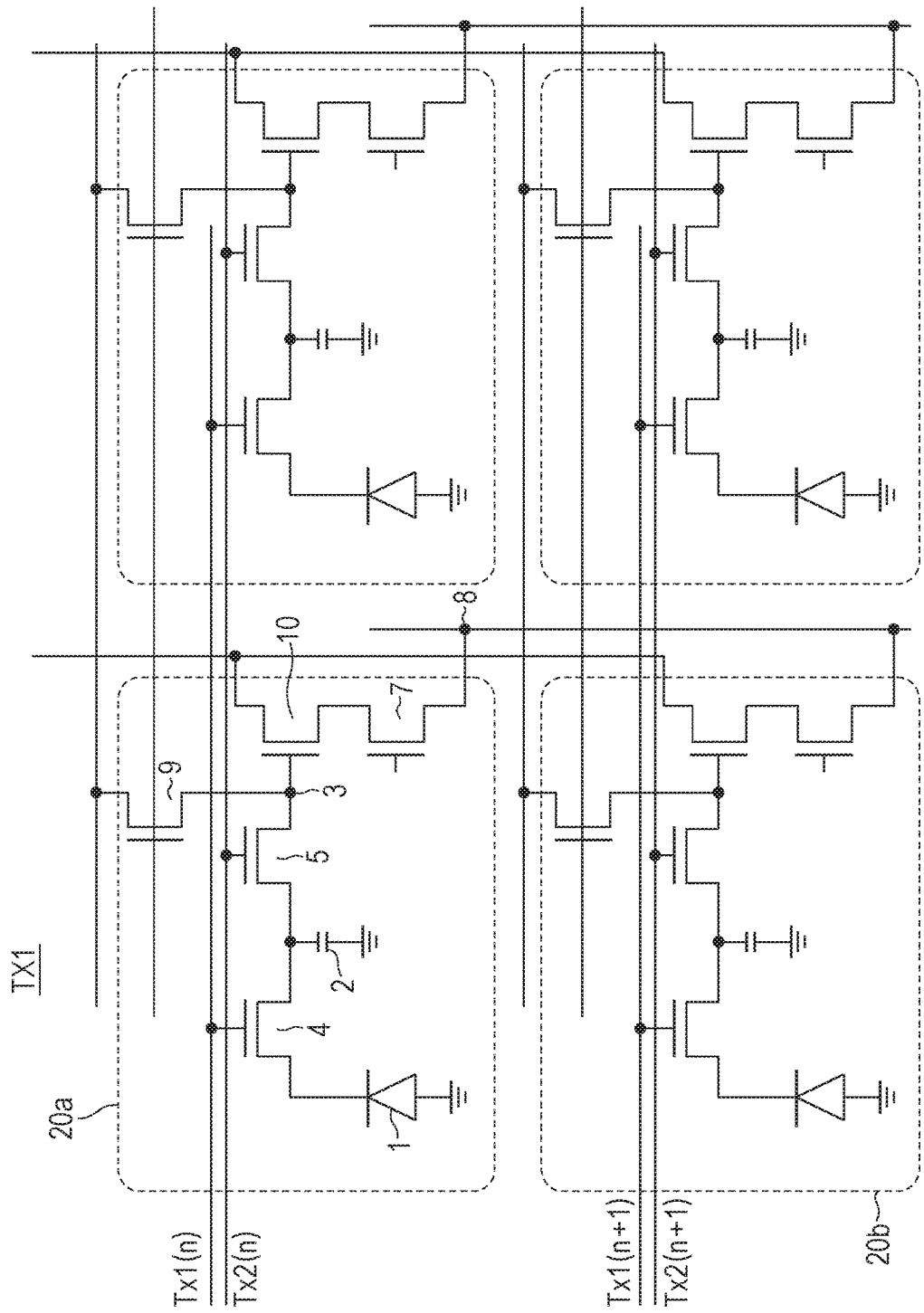
FIG. 1 illustrates equivalent circuits of pixels of an image capturing apparatus.

According to some embodiments, a pixel size may be reduced while increasing saturation charge quantity.

In the image capturing apparatus described in Japanese Patent Laid-Open No. 2004-111590, all the charge generated by photoelectric conversion for obtaining one image or one frame is accumulated in a photoelectric conversion unit. Then, charge is transferred from the photoelectric conversion units to accumulation units simultaneously with all the pixels, and another photoelectric conversion for obtaining the next image or the next frame is started. Therefore, in order to increase saturation charge quantity of pixels, saturation charge quantity of the photoelectric conversion unit and saturation charge quantity of the accumulation unit need to be substantially the same. If saturation charge quantity of the photoelectric conversion unit increases, an area of the photoelectric conversion unit also increases. Therefore, the pixel size may become large.

The inventors found that, in some image capturing apparatuses, increasing saturation charge quantity of pixels has been difficult. According to some embodiments, in an image capturing apparatus capable of performing a global electronic shutter, the pixel size may be reduced while increasing saturation charge quantity.

An embodiment provides an image capturing apparatus including a plurality of pixels and an output line to which signals from the plurality of pixels are output. Each of the plurality of pixels includes a photoelectric conversion unit, an accumulation unit configured to accumulate charge, and an amplifier unit configured to output a signal based on the charge generated by the photoelectric conversion unit. Each of the pixels is further provided with a first transfer switch configured to transfer the charge to the accumulation unit from the photoelectric conversion unit, and a second transfer switch configured to transfer the charge to the amplifier unit from the accumulation unit. With this configuration, an image pickup operation in which photoelectric conversion periods coincide among a plurality of pixels, i.e., a global electronic shutter, may be performed. An electronic shutter is, for example, defined as to electrically control accumulation of charge generated in response to incident light.

In some embodiments according to the present disclosure, at first time point, the photoelectric conversion units of the plurality of pixels start accumulation of charge simultaneously. From the first time point to, or until, second time point, the first transfer switches of the plurality of pixels are kept OFF. Charge generated in this period is accumulated in the photoelectric conversion units. The period from the first time point to the second time point corresponds to a first period. In other words, the first period may be defined as stating at the first time point and ending at the second time point.

In a period from the second time point to third time, corresponding to a second period, the accumulation units of the plurality of pixels accumulate charge. At this time, the accumulation units accumulate both of charge generated in the first period and charge generated in the second period. At the third time, the first transfer switches of the plurality of pixels are controlled from ON to OFF simultaneously.

In some embodiments according to the present disclosure, a ratio of saturation charge quantity of the photoelectric conversion unit to saturation charge quantity of the accumulation unit is substantially equal to a ratio of the length of the first period to the sum of the length of the first period and a length of the second period.

The size of the photoelectric conversion unit and the size of the accumulation unit may be reduced by driving these units in accordance with their saturation charge quantity relation. With this configuration, a global electronic shutter may be performed while reducing the pixel size and increasing saturation charge quantity.

Hereinafter, embodiments of the present disclosure will be described with reference to the drawings. Embodiments according to the present disclosure are not limited to those described below. For example, embodiments of the present disclosure also include: an example in which a configuration of any of the following embodiments is partially added to another embodiment; or an example in which a configuration of any of the following embodiments is replaced by a configuration of another embodiment. In the following embodiments, a first conductivity type is n-type and a second conductivity type is p-type. However, the first conductivity type may be p-type and the second conductivity type may be n-type.

First Embodiment

A first embodiment is described. FIG. 1 illustrates equivalent circuits of pixels of an image capturing apparatus. Only four pixels 20 are illustrated in FIG. 1, but the image capturing apparatus actually includes more pixels.

Each pixel 20 is provided with a photoelectric conversion unit 1, an accumulation unit 2, an amplifier unit 10, a first transfer switch 4, and a second transfer switch 5. The pixel 20 is further provided with a reset transistor 9 and a selection transistor 7.

In the photoelectric conversion unit 1 generates charge in response to incident light. The photoelectric conversion unit 1 accumulates charge generated in response to incident light. The first transfer switch 4 transfers the charge in the photoelectric conversion unit 1 to the accumulation unit 2. The accumulation unit 2 accumulates the charge generated by the incident light at a place other than the photoelectric conversion unit 1. The second transfer switch 5 transfers the charge in the accumulation unit 2 to an input node 3 of the amplifier unit 10. The reset transistor 9 resets a voltage of the input node 3 of the amplifier unit 10. The selection transistor 7 selects the pixel 20 that outputs a signal to an output line 8. The amplifier unit 10 outputs a signal based on the charge generated by the incident light to the output line 8. The amplifier unit 10 is, for example, a source follower. The first transfer switch 4 and the second transfer switch 5 are MOS transistors.

A control line Tx1 is connected to the first transfer switch 4. A control line Tx2 is connected to the second transfer switch 5. In the present embodiment, a plurality of pixels are arranged in a matrix pattern. A common control line is connected to pixels included in one row. Here, for example, pixels on the n-th row are described as control line Tx1($n$).

With this configuration, the photoelectric conversion unit 1 may accumulate the charge that is generated while the accumulation unit 2 accumulates the charge. Thus, an image pickup operation in which photoelectric conversion periods coincide among a plurality of pixels, i.e., a global electronic shutter, may be performed.

Figure 2:
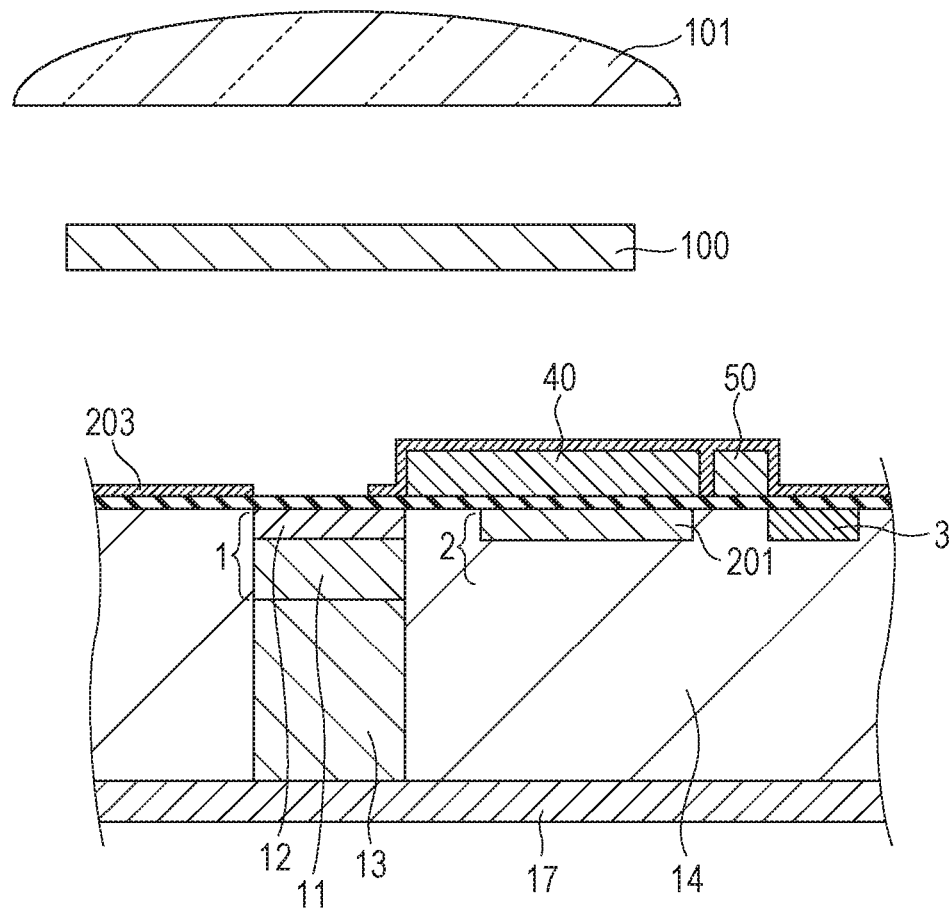
FIG. 2 is a diagram schematically illustrating a sectional structure of an image capturing apparatus.

FIG. 2 schematically illustrates a sectional structure of an image capturing apparatus. FIG. 2 illustrates a cross section of a pixel. Components having the same functions as those of FIG. 1 are denoted by the same reference numerals. FIG. 2 illustrates a front-side illumination image capturing apparatus, but a back-side illumination image capturing apparatus may also be used.

The photoelectric conversion unit 1 has an embedded photodiode structure. The photoelectric conversion unit 1 includes an n-type semiconductor region 11 and a p-type semiconductor region 12. The n-type semiconductor region 11 and the p-type semiconductor region 12 constitute a p-n junction. The p-type semiconductor region 12 may reduce noise in interfaces.

The p-type semiconductor region 14 is a well. The n-type semiconductor region 13 is disposed below the n-type semiconductor region 11. Impurity concentration of the n-type semiconductor region 13 is lower than the impurity concentration of the n-type semiconductor region 11. Thus, charge generated at a deep position is collected in the n-type semiconductor region. Here, the n-type semiconductor region 13 may be a p-type semiconductor region. A p-type semiconductor region 17 that becomes a potential barrier to the charge is disposed below the n-type semiconductor region 13.

The accumulation unit 2 includes an n-type semiconductor region 201. Charge that becomes a signal is accumulated in the n-type semiconductor region 201. Impurity concentration of the n-type semiconductor region 201 is higher than impurity concentration of the n-type semiconductor region 11.

A gate electrode 40 forms a gate of the first transfer switch 4. A gate electrode 50 forms a gate of the second transfer switch 5. A part of the gate electrode 40 is disposed above the n-type semiconductor region 201 via gate dielectric film. By applying a negative voltage to the gate electrode 40, a hole may be induced on a surface of the n-type semiconductor region 201. Thus, noise generated in interfaces may be reduced.

The accumulation unit 2 is shielded by a shading unit 203. The shading unit 203 is made of metal that does not easily transmit visible light, such as tungsten and aluminum. A color filter 100 and a microlens 101 are disposed on an opening of the shading unit 203.

The photoelectric conversion unit 1 and the accumulation unit 2 are disposed on a semiconductor substrate. In the present embodiment, an area of orthogonal projection of the photoelectric conversion unit 1 to a surface parallel to a surface of the semiconductor substrate is smaller than an area of orthogonal projection of the accumulation unit 2 to that surface. With this configuration, an effect that saturation charge quantity of pixels may be increased while reducing noise is obtained.

In order to increase saturation charge quantity of pixels, it is desirable that the accumulation unit 2 has large saturation charge quantity. Saturation charge quantity of the accumulation unit 2 may be increased by increasing impurity concentration of the n-type semiconductor region 201 of the accumulation unit 2, or by enlarging an area of the n-type semiconductor region 201 in a plan view. However, if impurity concentration of the n-type semiconductor region 201 is high, a leakage current and the like becomes large, which may cause greater noise. Therefore, saturation charge quantity may be increased while reducing impurity concentration of the n-type semiconductor region 201 by enlarging the area of the n-type semiconductor region 201 in a plan view.

Thus, saturation charge quantity of pixels may be increased while reducing noise by enlarging the area of the accumulation unit 2 in a plan view, i.e., the area of orthogonal projection of the accumulation unit 2. Then, the area of the photoelectric conversion unit 1 in a plan view is relatively easy to be small, and it is difficult to increase saturation charge quantity of the photoelectric conversion unit 1. Thus, an effect that saturation charge quantity of pixels may be maintained becomes more significant even if saturation charge quantity of the photoelectric conversion unit 1 is small.

Figure 3:
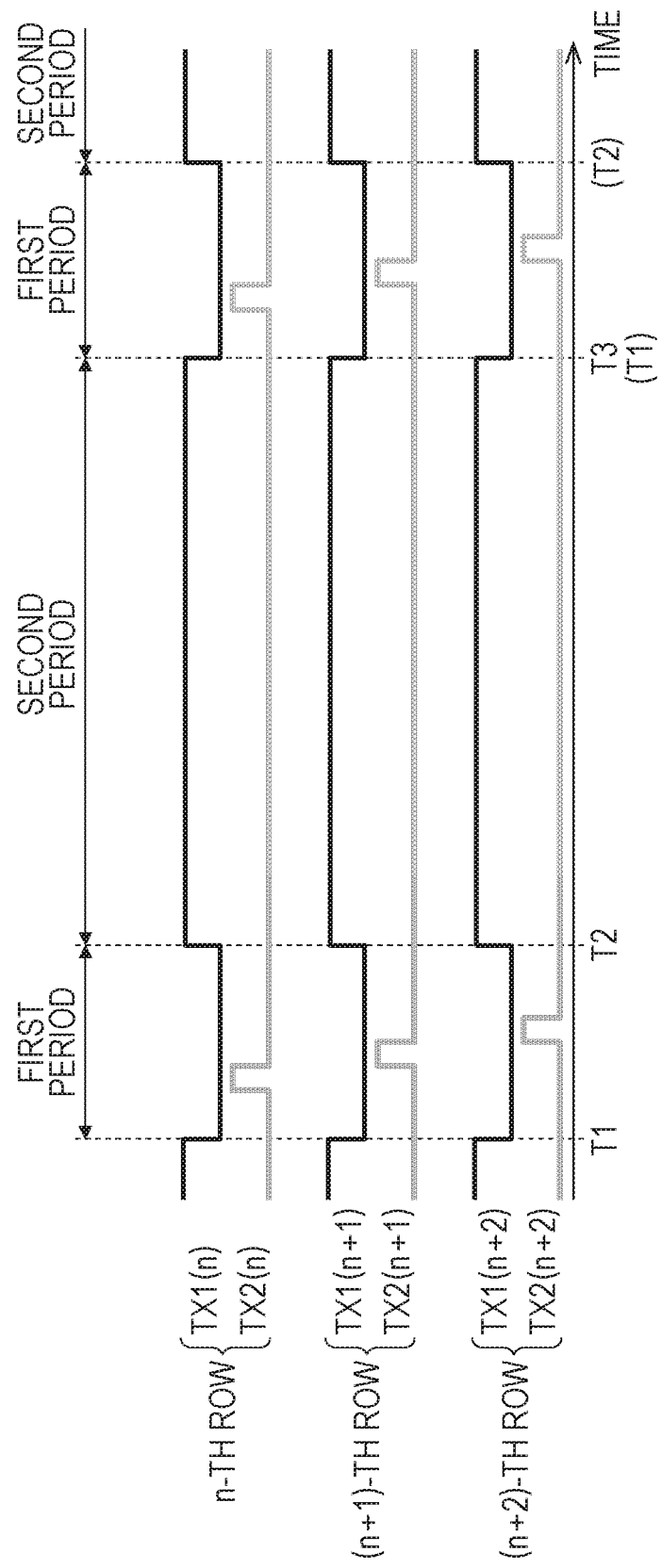
FIG. 3 is a diagram illustrating driving pulses of an image capturing apparatus.

A method for driving the image capturing apparatus of the present embodiment is described. FIG. 3 schematically illustrates driving pulses used in the present embodiment. FIG. 3 illustrates driving pulses supplied to the control line Tx1 of the first transfer switch 4 and to the control line Tx2 of the second transfer switch 5 of pixels on the n-th to the (n+2)th rows. A corresponding transistor or a corresponding switch is turned ON when the driving pulses are at a high level. A corresponding transistor or a corresponding switch is turned OFF when the driving pulses are at a low level. A control unit provided in the image capturing apparatus supplies these driving pulses. A logical circuit, such as a shift register and an address decoder, is used as the control unit.

A previous frame is exposed before time T1. "Exposure" means that charge generated during photoelectric conversion is accumulated or kept as a signal. Charge generated before time T1 is accumulated in the accumulation unit 2. The exposure of the previous frame ends when the first transfer switch 4 of charge from the photoelectric conversion unit 1 to the accumulation unit 2 is controlled from ON to OFF in all the pixels simultaneously (time T1 of FIG. 1).

At time T1, all the charge of the photoelectric conversion unit 1 is transferred to the accumulation unit. This means that the photoelectric conversion unit 1 becomes an initial state. Therefore, at time T1, the photoelectric conversion units 1 of pixels in three rows start accumulation of charge simultaneously. Thus, in the present embodiment, accumulation of charge by the photoelectric conversion units 1 is started when the first transfer switch 4 is turned OFF.

In a period from time T1 to time T2 in which a first period elapses, the first transfer switch 4 is kept OFF. In the present embodiment, the first transfer switches 4 of all the pixels are kept OFF. It is only necessary that, however, the first transfer switch 4 is kept OFF at at least one pixel in the period from time T1 to time T2.

Time when the first period elapsed since time T1 corresponds to time T2. That is, a period from time T1 to time T2 corresponds to the first period. In the first period, charge generated in the first period is accumulated in the photoelectric conversion unit 1. In the first period, the accumulation unit 2 accumulates charge generated in the previous frame.

In the first period, charge in the accumulation unit 2 is read sequentially to the input node 3 of the amplifier unit 10. Specifically, when the second transfer switch 5 of the n-th row is turned ON, charge in the accumulation unit 2 of the pixels of the n-th row is transferred to the input node 3. A voltage of the input node 3 changes in accordance with capacity of the input node 3 and quantity of the transferred charge. A signal based on the voltage of the input node is output to the output line 8 by the amplifier unit 10. Next, the same operation is performed to the pixels of the (n+1)th row. This operation is performed to each of the pixels on the first row to the last row. After reading on the last pixel is performed, the first transfer switches 4 and the second transfer switches 5 of all the pixels are turned OFF.

The first transfer switches 4 are turned ON at time T2. Then, charge in the photoelectric conversion unit 1 is transferred to the accumulation unit 2. That is, charge generated in the first period is accumulated in the accumulation unit 2 after time T2. In the present embodiment, the first transfer switches 4 of all the pixels are shifted ON from OFF simultaneously. It is only necessary that, however, the first transfer switches 4 of a plurality of pixels are turned ON by time T2, and the timings at which the pixels are turned ON may differ from each other. For example, beginning from the first transfer switch 4 of the pixel of which the above-described reading operation is completed, the first transfer switch 4 may be turned ON.

Then, in a period from time T2 to time T3 in which a second period elapses, the accumulation unit accumulates both charge generated in the first period and charge generated in the second period. In the present embodiment, the first transfer switches 4 are kept ON in the second period. Therefore, charge generated in the second period is immediately transferred to the accumulation unit 2. The period in which charge is transferred to the accumulation unit 2 from the photoelectric conversion unit 1 may be determined arbitrarily. The first transfer switches 4 may be turned OFF at a part of the second period.

At time T3, the first transfer switches 4 of pixels of all the rows are controlled from ON to OFF simultaneously. Then, an exposure period of one frame is completed. Thus, the exposure periods of all the pixels are identical. That is, in all the pixels, exposure is started at time T1 and completed at time T3. Exposure of a subsequent frame is started at time T3 and then operations in the period from time T1 to time T3 are repeated thereafter.

Figure 4:
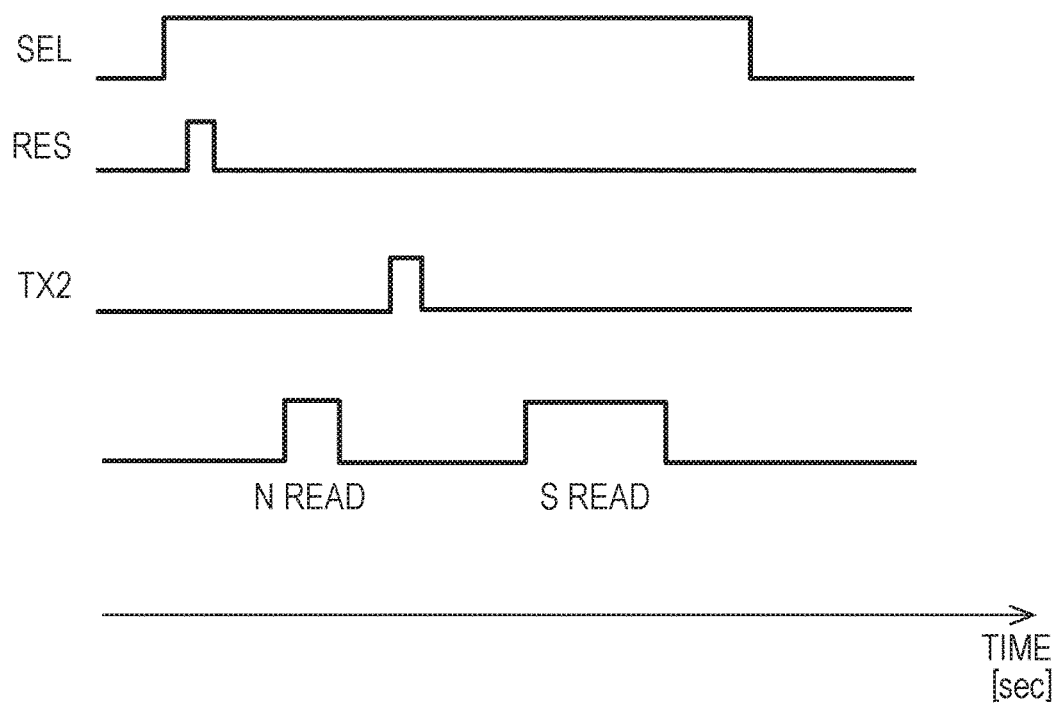
FIG. 4 is a diagram illustrating driving pulses of an image capturing apparatus.

Next, a reading operation of a signal from a single pixel is described briefly. FIG. 4 schematically illustrates driving pulses used in the image capturing apparatus. FIG. 4 illustrates a driving pulse SEL supplied to the selection transistor 7, a driving pulse RES supplied to the reset transistor 9, and a driving pulse Tx2 supplied to the second transfer switch 5. A corresponding transistor or a corresponding switch is turned ON when the driving pulses are at a high level. A corresponding transistor or a corresponding switch is turned OFF when the driving pulses are at a low level.

In response to the driving pulses illustrated in FIG. 4, selection of pixel, resetting, reading of a noise signal (N reading), transfer of charge, and reading of an optical signal (S reading) are performed. The output signal may be AD converted outside the image capturing apparatus. Alternatively, the output signal may be AD converted inside the image capturing apparatus.

Figure 5:
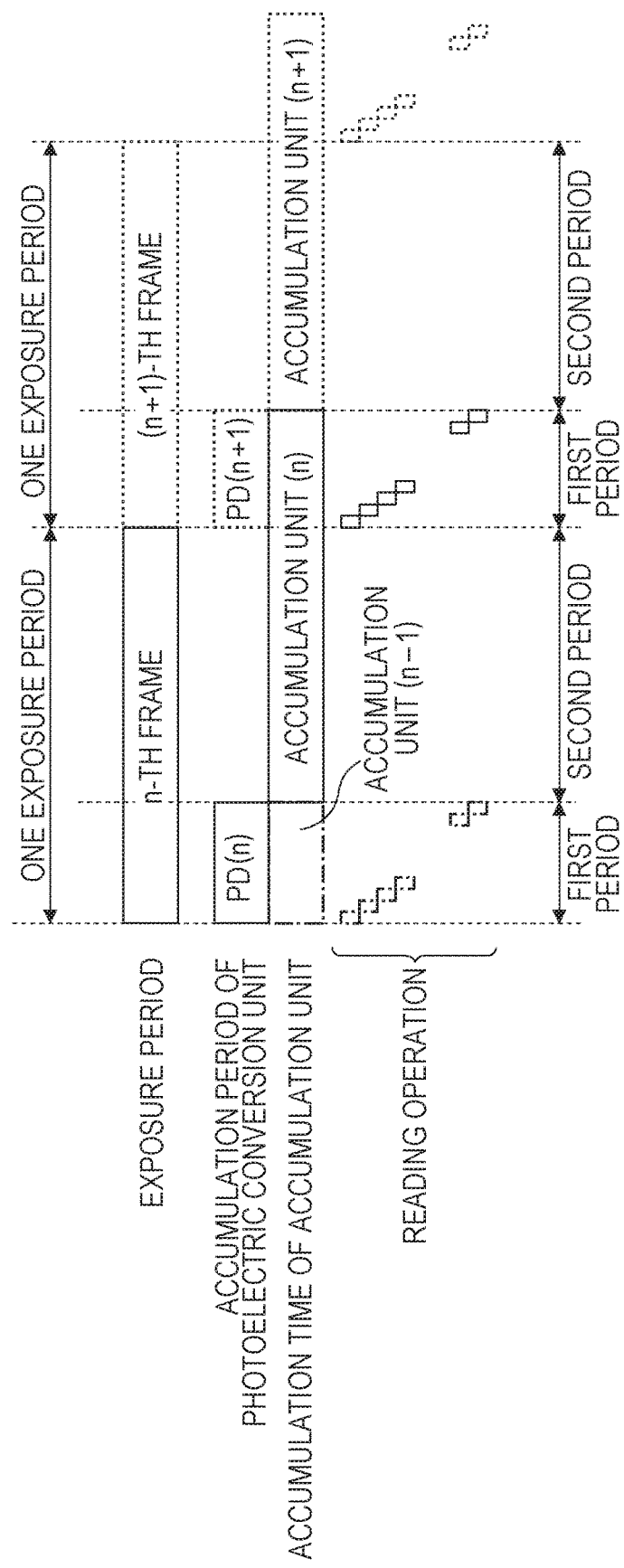
FIG. 5 is a diagram schematically illustrating an operation of an image capturing apparatus.

FIG. 5 schematically illustrates an operation of the image capturing apparatus. FIG. 5 illustrates an image pickup operation of from the n-th frame to the (n+1)th frame. An operation about the n-th frame is illustrated by a solid line and an operation about the (n+1)th frame is illustrated by a dotted line.

FIG. 5 illustrates an exposure period in each frame, a period in which the photoelectric conversion unit 1 accumulates charge, and a period in which the accumulation unit 2 accumulates charge. FIG. 5 illustrates that reading operations of a plurality of pixels are performed in the first period. The reading operation in FIG. 5 is an operation including transfer of charge by the second transfer switch 5 and output of a signal by the amplifier unit 10 which are described with reference to FIGS. 3 and 4.

As illustrated in FIG. 5, immediately after the exposure of one frame is completed, the next exposure may be started. Therefore, since there is substantially no period in which information is missing, image quality may be improved.

As illustrated in FIG. 5, in the first period in which the photoelectric conversion unit 1 is accumulating charge, the reading operation is performed to each of a plurality of pixels. For this reason, even if saturation charge quantity of the photoelectric conversion unit 1 is small, saturation charge quantity of pixels may be increased. Saturation charge quantity of pixels is, for example, defined as the maximum value of the amount of charge that is treated as a signal among charge generated in one exposure event, or a single frame. Saturation charge quantity of the photoelectric conversion unit 1 is, for example, defined as the maximum value of the amount of charge that is accumulated by the photoelectric conversion unit 1, and saturation charge quantity of the accumulation unit 2 is, for example, defined as the maximum value of the amount of charge that is accumulated by the accumulation unit 2.

The exposure period of one exposure event is the sum of the first period and the second period. Here, charge of the previous frame accumulated in the accumulation unit 2 is read in the first period. Thus, when the first period ends, the accumulation unit 2 may accumulate the charge. Therefore, it is only necessary that the photoelectric conversion unit 1 may accumulate at least the charge generated in the first period. Since the amount of change generated in the first period is usually smaller than the amount of charge generated in one exposure period, saturation charge quantity of the photoelectric conversion unit 1 may be made small.

In the present embodiment, as illustrated in FIG. 5, the second period in which the accumulation unit 2 accumulates the charge is longer than the first period. Therefore, saturation charge quantity of the photoelectric conversion unit 1 may be made even smaller. However, the first period may be equal to or longer than the second period.

FIG. 5 illustrates an example in which the reading operation is performed sequentially beginning from the first row. However, the order in which the reading operation is performed is not limited to this example. It is only necessary that at least one reading operation is performed to each of the pixels that constitute one frame in the first period. In at least some of the pixels, a period after the accumulation unit 2 starts accumulation of charge in a certain frame until the same accumulation unit 2 starts accumulation of charge in a subsequent frame is equal to the exposure period.

It is desirable that a ratio of the first period to the sum of the first period and the second period and the ratio of saturation charge quantity of the photoelectric conversion unit 1 to saturation charge quantity of the accumulation unit 2 are substantially equal. In particular, if saturation charge quantity of the photoelectric conversion unit 1 is denoted by $A_1$, saturation charge quantity of the accumulation unit 2 is denoted by $A_2$, the first period is denoted by $P_1$, and the second period is denoted by $P_2$, $A_1$, $A_2$, $P_1$ and $P_2$ satisfy the relationship of the following Expression (1). Here, the sum of the first period $P_1$ and the second period $P_2$ corresponds to one exposure period $P_1 + P_2$.

$$\frac{P_1 - 0.5 \times P_1}{(P_1 + P_2)} \leq \frac{A_1}{A_2} \leq \frac{P_1 - 0.5 \times P_2}{(P_1 + P_2)} \quad (1)$$

More desirably, a ratio of the first period to the sum of the first period and the second period is equal to a ratio of saturation charge quantity of the photoelectric conversion unit 1 to saturation charge quantity of the accumulation unit 2. That is, $A_1$, $A_2$, $P_1$ and $P_2$ satisfy a relationship of the following Expression (2):

$$\frac{A_1}{A_2} = \frac{P_1}{(P_1 + P_2)}. \quad (2)$$

In the present embodiment, a ratio of one exposure period to the first period is 4. That is, the first period is ¼ in length of one exposure period. For example, in a case in which a moving image is captured at 60 frames per second, the exposure period is ⅟60 second, and the first period is ⅟240 second.

Therefore, it is desirable that the ratio of saturation charge quantity of the photoelectric conversion unit 1 to saturation charge quantity of the accumulation unit 2 is close to ¼. This is because accumulation unit 2 accumulates all of the charge generated in one exposure period whereas the photoelectric conversion unit 1 only needs to accumulate ¼ in amount of that charge. Specifically, in a case in which saturation charge quantity of the accumulation unit 2 is 40000 electrons, it is desirable that saturation charge quantity of the photoelectric conversion unit 1 is equal to or greater than 5000 electrons and is equal to or smaller than 25000 electrons. Preferably, saturation charge quantity of the photoelectric conversion unit 1 is 10000 electrons.

By setting the ratio of saturation charge quantity as expressed by Expression (1), the optimum size of the photoelectric conversion unit 1 and the accumulation unit 2 may be determined.

In a case in which charge overflowed from the photoelectric conversion unit 1 is to be accumulated by the accumulation unit 2, it is desirable that $A_1$, $A_2$, $P_1$ and $P_2$ satisfy the following Expression (3):

$$\frac{P_1 - 0.5 \times P_1}{(P_1 + P_2)} \leq \frac{A_1}{A_2} < \frac{P_1}{(P_1 + P_2)}. \quad (3)$$

Specifically, in a case in which saturation charge quantity of the accumulation unit 2 is 40000 electrons, saturation charge quantity of photoelectric conversion unit 1 is equal to or greater than 5000 electrons and equal to or smaller than 10000 electrons. With this configuration, since the charge overflowed from the photoelectric conversion unit 1 may be accumulated by the accumulation unit 2, mixing of charge may be reduced.

If $A_1$, $A_2$, $P_1$ and $P_2$ satisfy the following Expression (4), the photoelectric conversion unit 1 may have a greater amount of saturation charge quantity. Therefore, overflowing of charge may be reduced.

$$\frac{P_1}{(P_1 + P_2)} < \frac{A_1}{A_2} \leq \frac{P_1 + 0.5 \times P_2}{(P_1 + P_2)} \quad (4)$$

The image capturing apparatus of the present embodiment may have an operation mode for performing a rolling shutter. In the operation mode of a rolling shutter, accumulation of charge by the photoelectric conversion units 1 of a plurality of pixels is started sequentially. Then, the first transfer switches 4 of a plurality of pixels are sequentially turned ON. Alternatively, the image capturing apparatus may have an operation mode for performing a global electronic shutter of another scheme. In the global electronic shutter of another scheme, a period in which the photoelectric conversion unit 1 accumulates charge is equal to the exposure period.

As described above, according to the image capturing apparatus of the present embodiment, a global electronic shutter may be performed while increasing saturation charge quantity.

Second Embodiment

Another embodiment is described. The present embodiment differs from the first embodiment in the configuration of the accumulation unit. Thus, only a difference from the first embodiment is described and description of the same configuration as that of the first embodiment is omitted.

Equivalent circuits of the present embodiment are the same as those of the first embodiment. FIG. 1 illustrates equivalent circuits of pixels of the image capturing apparatus of the present embodiment. Description about FIG. 1 is the same as that of the first embodiment and is thus omitted.

A driving method of the present embodiment is the same as that of the first embodiment. That is, FIGS. 3 and 4 schematically illustrate driving pulses used in the present embodiment. FIG. 5 schematically illustrates an operation of the image capturing apparatus of the present embodiment. Description about FIGS. 3 to 5 is the same as that of the first embodiment and is thus omitted.

Figure 6:
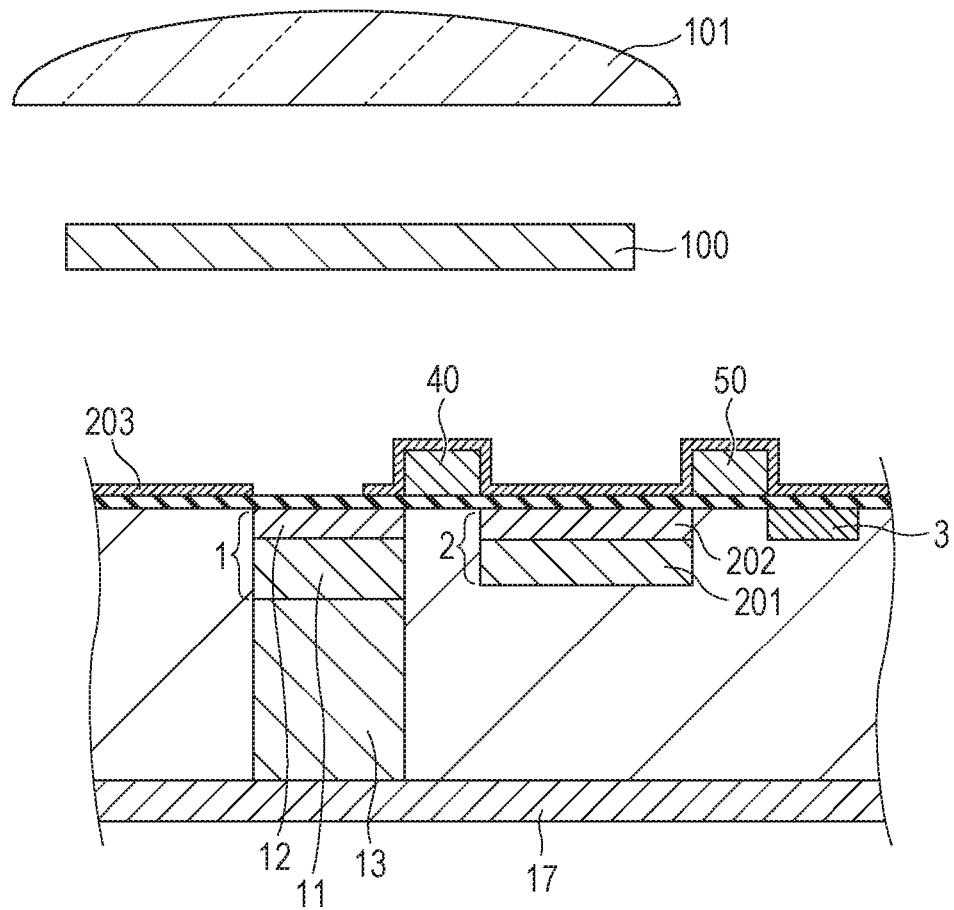
FIG. 6 is a diagram schematically illustrating a sectional structure of an image capturing apparatus.

FIG. 6 schematically illustrates a sectional structure of the image capturing apparatus. FIG. 6 illustrates a cross section of a pixel. Components having the same functions as those of FIGS. 1 to 5 are denoted by the same reference numerals.

An accumulation unit 2 includes an n-type semiconductor region 201 and a p-type semiconductor region 202. The p-type semiconductor region 202 is disposed above the n-type semiconductor region 201. The p-type semiconductor region 202 may reduce noise in interfaces.

A gate electrode 40 of a first transfer switch 4 does not extend onto the n-type semiconductor region 201. Thus, restriction on the layout is decreased, and a degree of freedom of design may be increased.

As described above, according to the present embodiment, in addition to the effect of the first embodiment, noise may be reduced.

Third Embodiment

Still another embodiment is described. The present embodiment differs from the first embodiment and the second embodiment in that a pixel is provided with a discharge switch. Thus, only a difference from the first embodiment and the second embodiment is described and description of the same configuration as that of the first embodiment or the second embodiment is omitted.

Figure 7:
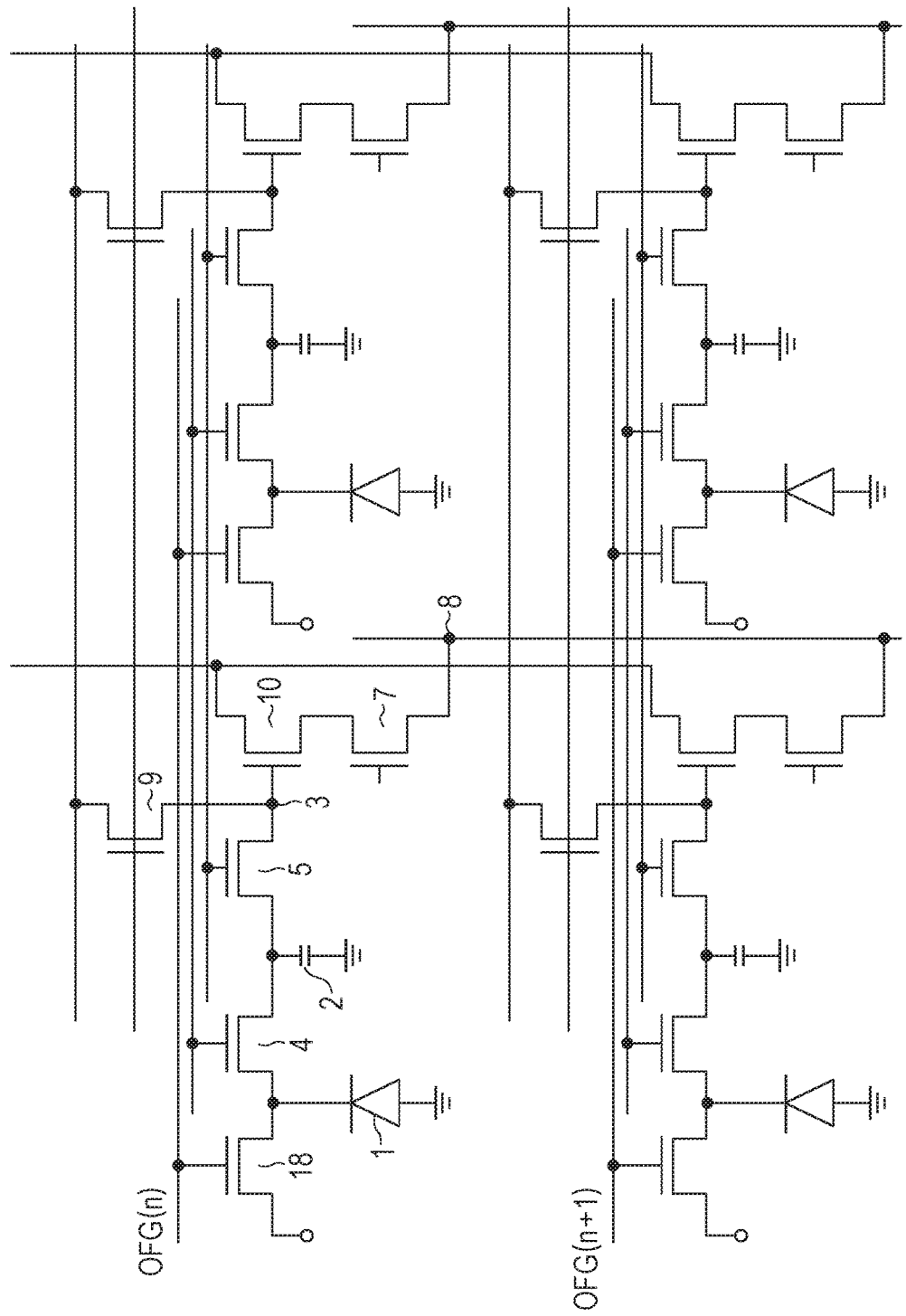
FIG. 7 is a diagram illustrating equivalent circuits of an image capturing apparatus.

FIG. 7 illustrates equivalent circuits of pixels of an image capturing apparatus. The same components as those of FIG. 1 are denoted by the same reference numerals. To make the drawing simple, the reference numeral of a control line Tx1 and the reference numeral of a control line Tx2 are omitted.

The control line Tx1 and the control line Tx2 are the same in configuration as those of the first embodiment. Each pixel is provided with a discharge switch 18. The discharge switch 18 discharges charge in the photoelectric conversion unit 1 to a power node, such as an overflow drain. A control line OFG is connected to the discharge switch 18. The discharge switch 18 is, for example, a MOS transistor.

Figure 9:
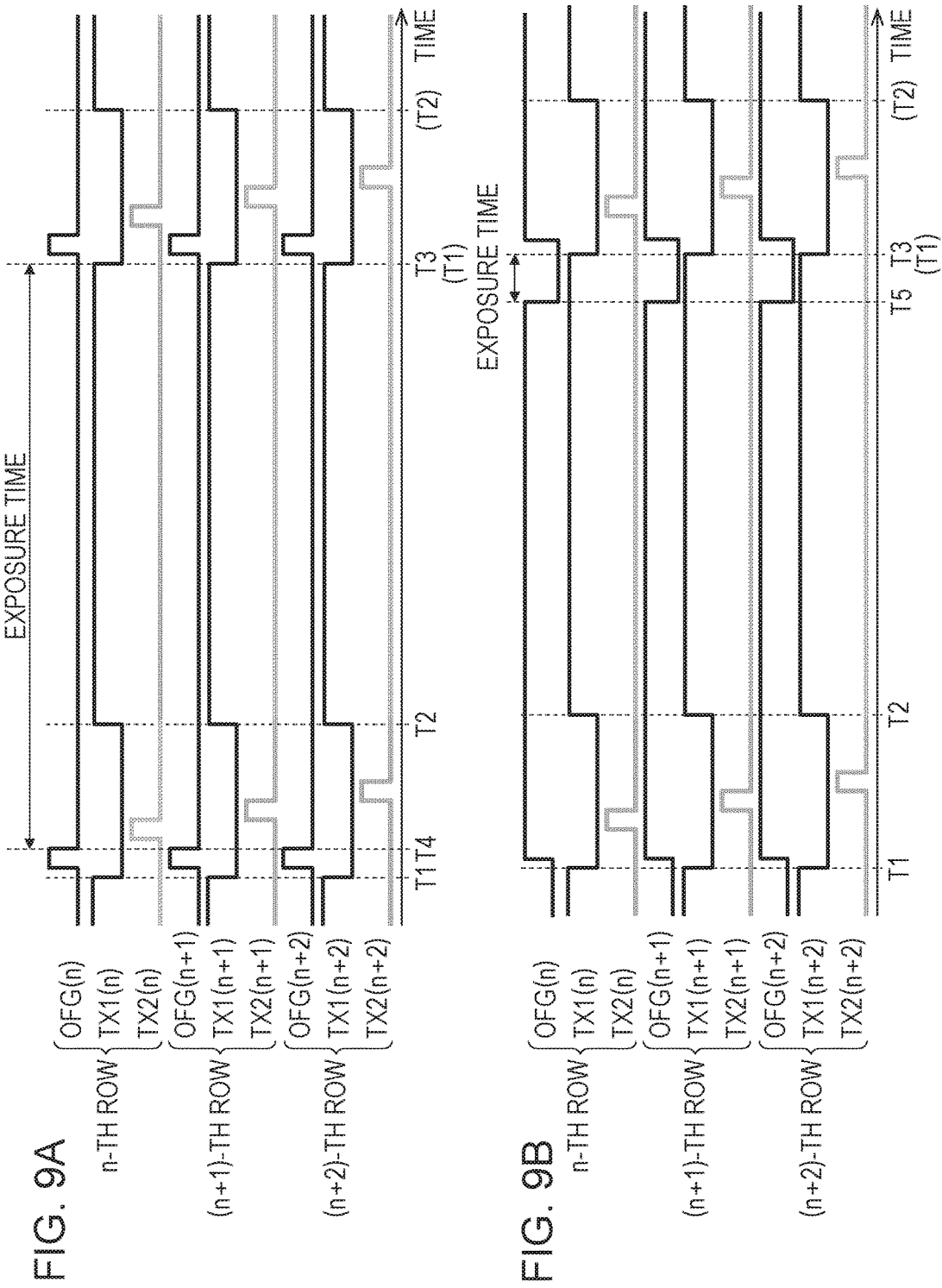
FIGS. 9A and 9B are diagrams illustrating driving pulses of an image capturing apparatus.

In the first embodiment, accumulation of charge by the photoelectric conversion unit 1 is started when the second transfer switch 5 is controlled from ON to OFF. In the present embodiment, as illustrated in FIGS. 9A and 9B, it is also possible to control the discharge switch 18 to control the start of the exposure. Specifically, when the discharge switch 18 is controlled from ON to OFF, accumulation of charge by the photoelectric conversion unit 1 is started. In this manner, exposure time may be set arbitrarily.

Figure 8:
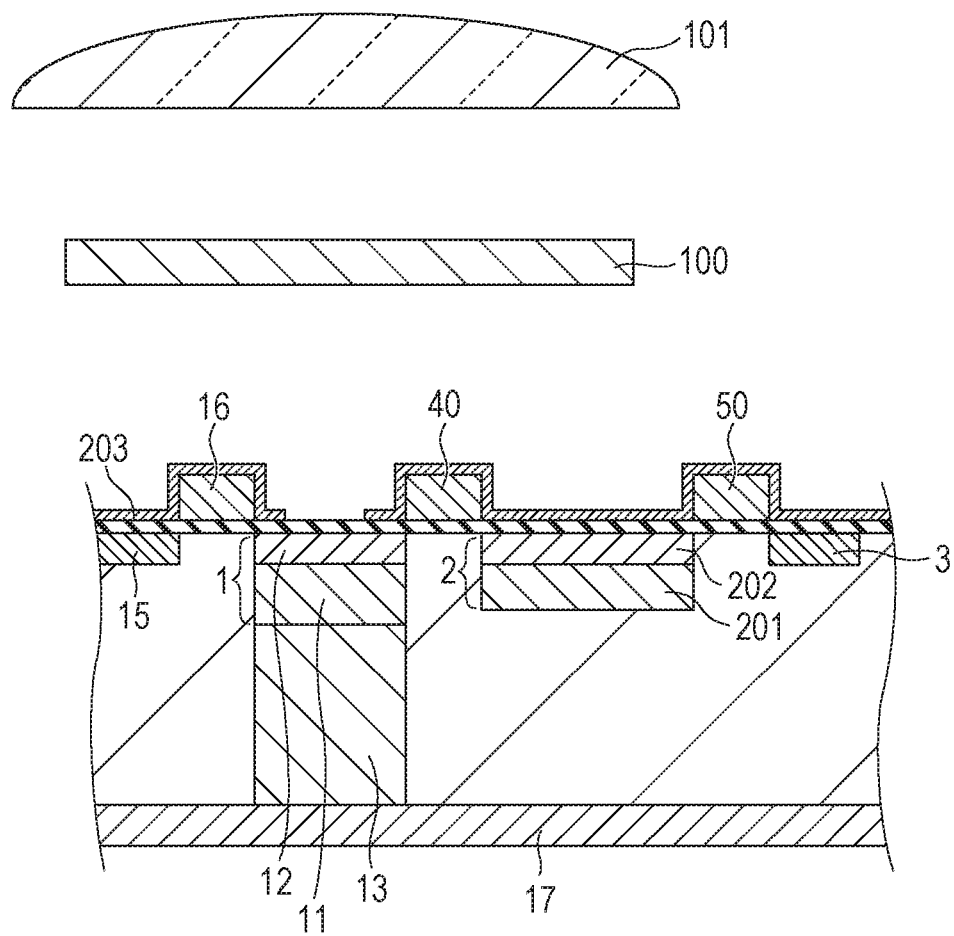
FIG. 8 is a diagram schematically illustrating a sectional structure of an image capturing apparatus.

FIG. 8 schematically illustrates a sectional structure of the image capturing apparatus. Components having the same functions as those of FIGS. 1 and 2 are denoted by the same reference numerals. FIG. 8 illustrates an example in which an accumulation unit 2 includes a p-type semiconductor region 202 as in the second embodiment. The accumulation unit 2 does not necessarily include the p-type semiconductor region 202 as in FIG. 1.

The discharge switch 18 is provided with an overflow control electrode 16 and an overflow drain 15. Charge in the photoelectric conversion unit 1 is discharged to the overflow drain 15 depending on a voltage supplied to the overflow control electrode 16. A predetermined voltage is supplied to the overflow drain 15. The overflow control electrode 16 and the overflow drain 15 are shielded by a shading unit 203.

A method for driving the image capturing apparatus of the present embodiment is described. FIGS. 9A and 9B schematically illustrate driving pulses used in the present embodiment. FIGS. 9A and 9B illustrate driving pulses supplied to a control line Tx1, a control line Tx2, and a control line OFG of pixels on the n-th to the (n+2)th rows. The driving pulses supplied to the control line Tx1 and to the control line Tx2 are the same as those in the first embodiment.

A corresponding transistor or a corresponding switch is turned ON when the driving pulses are at a high level. A corresponding transistor or a corresponding switch is turned OFF when the driving pulses are at a low level. A control unit provided in the image capturing apparatus supplies these driving pulses. A logical circuit, such as a shift register and an address decoder, is used as the control unit.

FIGS. 9A and 9B are different in timing at which the discharge switch 18 is operated. In FIG. 9A, the discharge switch 18 is controlled from ON to OFF at time T4. The generated charge is discharged while the discharge switch 18 is kept ON. Therefore, according to the driving of FIG. 9A, the exposure period corresponds to a period from time T4 to time T3. In FIG. 9B, the discharge switch 18 is controlled from ON to OFF at time T5. Therefore, according to the driving of FIG. 9B, the exposure period corresponds to a period from time T5 to time T3.

According to the present embodiment, the driving method may be changed depending on the brightness of the object. For example, the driving pulses illustrated in FIG. 3 are used at normal times, the driving pulses illustrated in FIG. 9A are used when the object is bright, and the driving pulses illustrated in FIG. 9B are used when the object is even brighter.

In FIG. 9A, accumulation of charge by the photoelectric conversion unit 1 is started at time T4. In a period from time T4 to time T3, the discharge switch 18 is kept OFF.
A reading operation is performed in accordance with the driving pulses illustrated in FIG. 4.

As described above, according to the present embodiment, in addition to the effect of the first embodiment, the exposure time may be set arbitrarily.

Fourth Embodiment

Still another embodiment is described. The present embodiment differs from the first to the third embodiments in that a waveguide that guides light to the photoelectric conversion unit is provided. Thus, only a difference from the first to the third embodiments is described and description of the same configuration as any of those of the first to the third embodiments is omitted.

Equivalent circuits of the present embodiment are the same as those of the first embodiment or the third embodiment. That is, FIG. 1 and FIG. 7 illustrate equivalent circuits of pixels of an image capturing apparatus of the present embodiment. Since description about FIG. 1 is the same as that of the first embodiment and description about FIG. 7 is the same as that of the third embodiment, description of FIGS. 1 and 7 is omitted.

A driving method of the present embodiment is the same as that of the first embodiment or the third embodiment. That is, in a case in which a pixel is not provided with a discharge switch, the driving pulses illustrated in FIGS. 3 and 4 are used. In a case in which a pixel is provided with a discharge switch, driving pulses illustrated in FIGS. 9A, 9B and 4 are used. FIG. 5 schematically illustrates an operation of the image capturing apparatus of the present embodiment. Since description about FIGS. 3 to 5 is the same as that of the first embodiment and description about FIGS. 9A and 9B is the same as that of the third embodiment, description of FIGS. 3 to 5, 9A and 9B is omitted.

Figure 10:
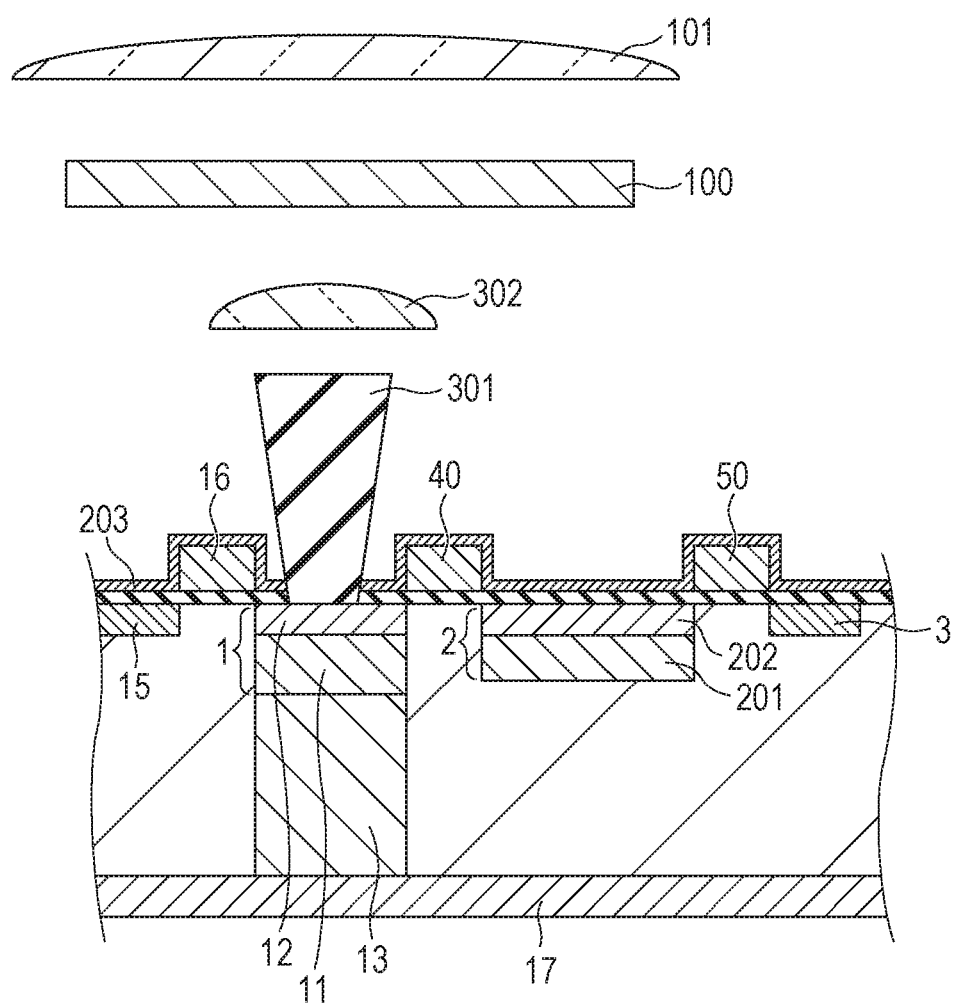
FIG. 10 is a diagram schematically illustrating a sectional structure of an image capturing apparatus.

FIG. 10 schematically illustrates a sectional structure of the image capturing apparatus. The same components as those of FIG. 1, 2, 6, 7 or 8 are denoted by the same reference numerals. FIG. 10 illustrates an example in which, as in the second embodiment, an accumulation unit 2 includes a p-type semiconductor region 202 and, as in the third embodiment, a pixel is provided with a discharge switch 18. However, the p-type semiconductor region 202 and the discharge switch 18 may be omitted.

In the present embodiment, a waveguide 301 is disposed to correspond to the photoelectric conversion unit 1. The waveguide 301 guides incident light to the photoelectric conversion unit 1. Thus, sensitivity may be increased. Especially, a decrease in sensitivity to obliquely incident light may be reduced.

A publicly known structure is used for the waveguide 301. In the present embodiment, the waveguide 301 is formed by a material having a refractive index higher than that of surrounding insulating film. For example, the surrounding insulating film may be formed by interlayer insulation film constituted by silicon oxide film, and the waveguide 301 may be formed by silicon nitride film. Alternatively, a reflecting layer is provided on the periphery of the waveguide 301. The waveguide 301 may be disposed to correspond to the photoelectric conversion units 1 of all the pixels, or may be disposed to correspond only to the photoelectric conversion units 1 of some of the pixels.

An innerlayer lens 302 may be disposed between a color filter 100 and the waveguide 301. The innerlayer lens 302 condenses light that has passed the color filter 100 onto the waveguide 301. Sensitivity may be increased by the innerlayer lens 302. Especially, a decrease in sensitivity to obliquely incident light may be reduced.

As described above, according to the present embodiment, in addition to the effect of the first embodiment, sensitivity may be increased. Especially in a case in which an area of the photoelectric conversion unit 1 in a plan view has been reduced to increase an area of the accumulation unit 2 in a plan view, the effect of increasing sensitivity is significant.

Fifth Embodiment

Still another embodiment is described. The present embodiment differs from the first to the fourth embodiments in the configuration of the accumulation unit. Thus, only a difference from the first to the fourth embodiments is described and description of the same configuration as any of those of the first to the fourth embodiments is omitted.

Equivalent circuits of the present embodiment are the same as those of the first embodiment or the third embodiment. That is, FIG. 1 and FIG. 7 illustrate equivalent circuits of pixels of an image capturing apparatus of the present embodiment. Since description about FIG. 1 is the same as that of the first embodiment and description about FIG. 7 is the same as that of the third embodiment, description of FIGS. 1 and 7 is omitted.

A driving method of the present embodiment is the same as that of the first embodiment or the third embodiment. That is, in a case in which a pixel is not provided with a discharge switch, the driving pulses illustrated in FIGS. 3 and 4 are used. In a case in which a pixel is provided with a discharge switch, driving pulses illustrated in FIGS. 9A, 9B and 4 are used. FIG. 5 schematically illustrates an operation of the image capturing apparatus of the present embodiment. Since description about FIGS. 3 to 5 is the same as that of the first embodiment and description about FIGS. 9A and 9B is the same as that of the third embodiment, description of FIGS. 3 to 5, 9A and 9B is omitted.

Figure 11:
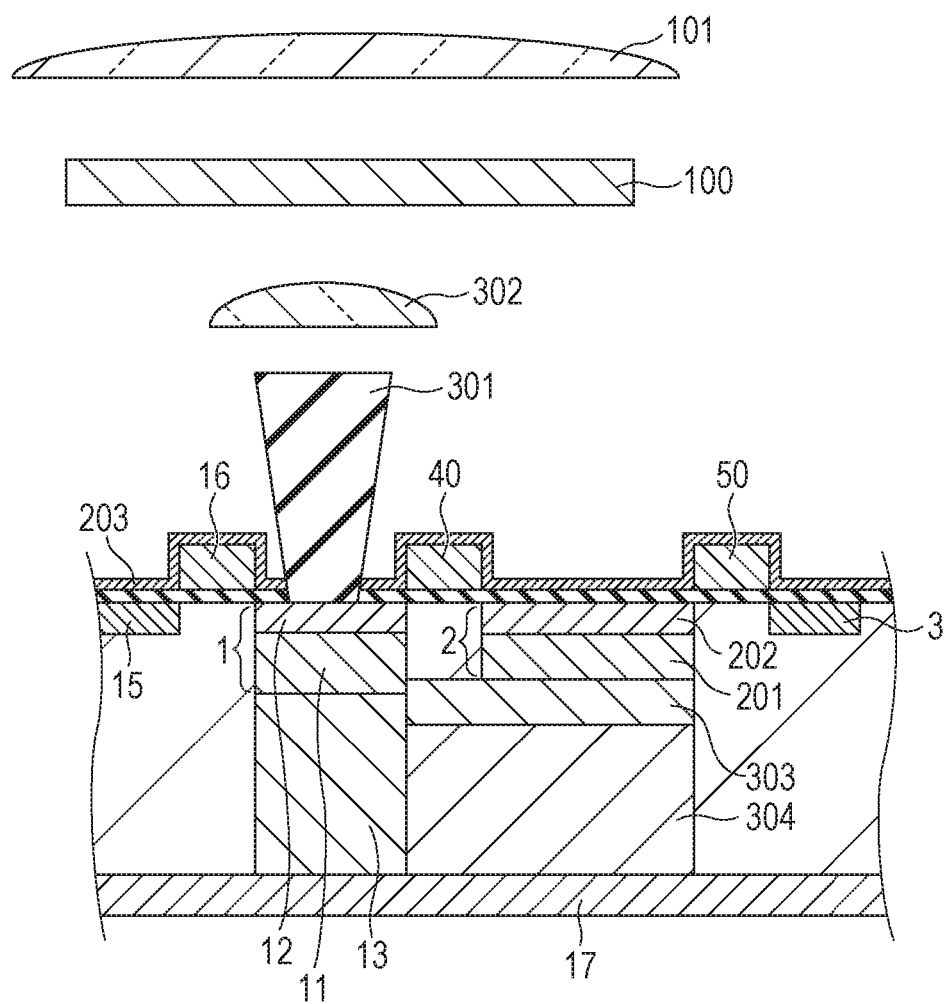
FIG. 11 is a diagram schematically illustrating a sectional structure of an image capturing apparatus.

FIG. 11 schematically illustrates a sectional structure of the image capturing apparatus. The same components as those of FIG. 1, 2, 6, 7, 8 or 10 are denoted by the same reference numerals. FIG. 11 illustrates an example in which, as in the second embodiment, an accumulation unit 2 includes a p-type semiconductor region 202 and, as in the third embodiment, a pixel is provided with a discharge switch 18. However, the p-type semiconductor region 202 and the discharge switch 18 may be omitted. FIG. 11 illustrates an example in which a waveguide 301 and an innerlayer lens 302 are provided. However, the waveguide 301 and the innerlayer lens 302 may be omitted.

In the present embodiment, below the n-type semiconductor region 201 that is included in the accumulation unit 2 and accumulates charge, a p-type semiconductor region 303 and a p-type semiconductor region 304 are disposed. The p-type semiconductor region 304 is disposed below the p-type semiconductor region 303. Impurity concentration of the p-type semiconductor region 303 is higher than impurity concentration of the p-type semiconductor region 304. With this configuration, ingress of the charge located at a deep portion of a substrate into the n-type semiconductor region 201 may be prevented. Therefore, noise may be reduced.

In the present embodiment, the p-type semiconductor region 304 extends to reach a p-type semiconductor region 17. With this configuration, mixing of colors of charge among pixels may be reduced.

As described above, according to the present embodiment, in addition to the effect of the first embodiment, noise may be reduced.

Sixth Embodiment

Still another embodiment is described. The present embodiment differs from the first to the fifth embodiments in the driving method. Thus, only a difference from the first to the fifth embodiments is described and description of the same configuration as any of those of the first to the fifth embodiments is omitted.

Equivalent circuits of the present embodiment are the same as those of the first embodiment or the third embodiment. That is, FIG. 1 and FIG. 7 illustrate equivalent circuits of pixels of an image capturing apparatus of the present embodiment. Since description about FIG. 1 is the same as that of the first embodiment and description about FIG. 7 is the same as that of the third embodiment, description of FIGS. 1 and 7 is omitted.

A sectional structure of a pixel of the present embodiment is the same as those of the first to the fifth embodiments. That is, FIGS. 2, 6, 8, 10 and 11 schematically illustrate a sectional structure of a pixel of the present embodiment.

Figure 12:
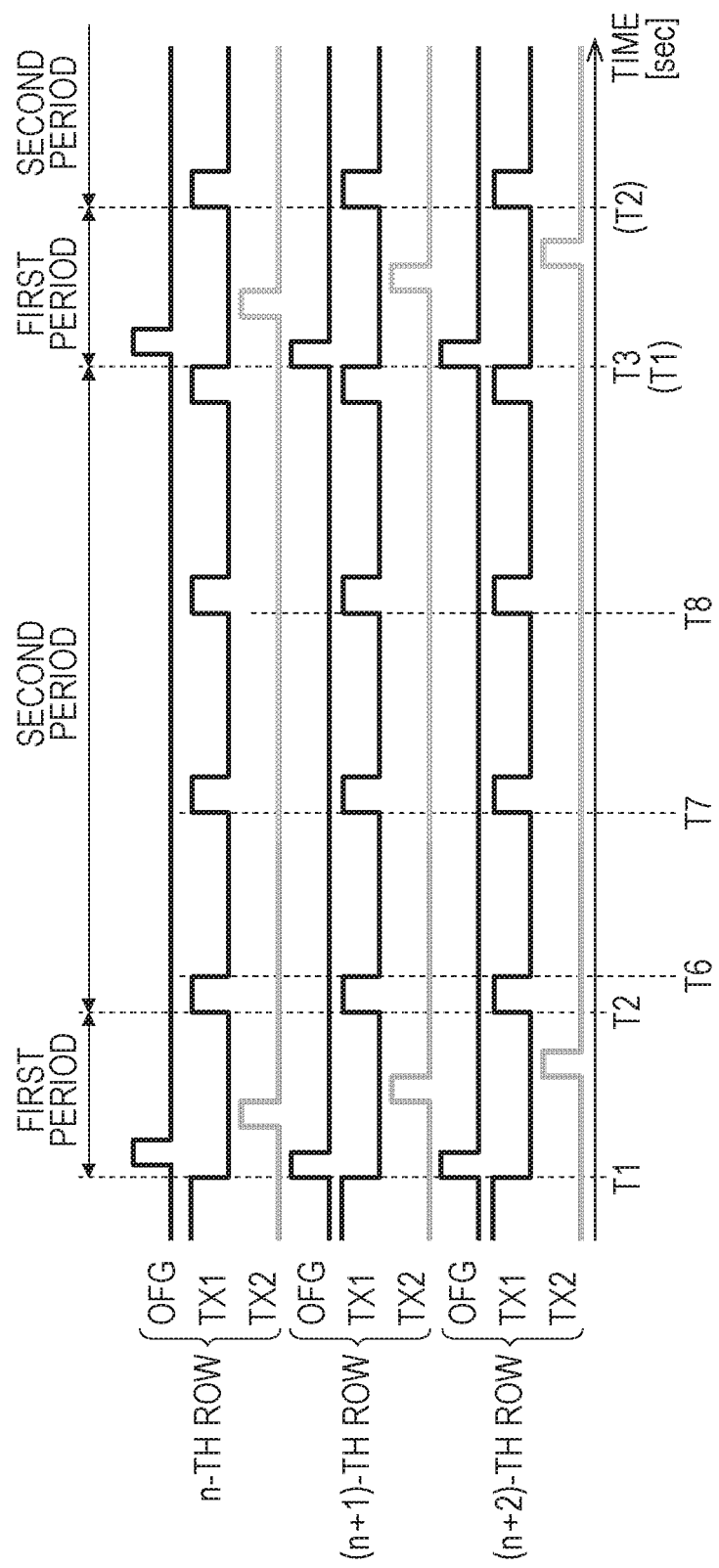
FIG. 12 is a diagram illustrating driving pulses of an image capturing apparatus.

A method for driving the image capturing apparatus of the present embodiment is described. FIG. 12 schematically illustrates driving pulses used in the present embodiment. FIG. 12 illustrates driving pulses supplied to a control line Tx1, a control line Tx2, and a control line OFG of pixels on the n-th to the (n+2)th rows. The driving pulses supplied to the control line Tx1, the control line Tx2, and the control line OFG are the same as those in the first embodiment or in the third embodiment. In a case in which a pixel is not provided with a discharge switch 18, the driving pulses supplied to the control line OFG are unnecessary.

A corresponding transistor or a corresponding switch is turned ON when the driving pulses are at a high level. A corresponding transistor or a corresponding switch is turned OFF when the driving pulses are at a low level. A control unit provided in the image capturing apparatus supplies these driving pulses. A logical circuit, such as a shift register and an address decoder, is used as the control unit.

In the present embodiment, the first transfer switch 4 is turned OFF at a part of a second period. Specifically, at time T6, the first transfer switch 4 is controlled from ON to OFF. Then, at time T7, the first transfer switch 4 is controlled from OFF to ON. With this configuration, a period in which the first transfer switch 4 is turns ON may be shortened. Therefore, noise generated in the first transfer switch 4 may be reduced.

In the present embodiment, the first transfer switch 4 is again controlled from OFF to ON at time T8. Thus, control of the first transfer switch 4 to ON from OFF is performed a plurality of times in the second period. With this configuration, noise may further be reduced.

It is desirable that the number of times of control of the first transfer switch 4 to ON from OFF is the same as or greater than a ratio of saturation charge quantity of the accumulation unit 2 to saturation charge quantity of photoelectric conversion unit 1. In the present embodiment, a ratio of saturation charge quantity of the accumulation unit 2 to saturation charge quantity of the photoelectric conversion unit 1 is 4. Therefore, control of the first transfer switch 4 to ON from OFF is performed four times in the second period.

As described above, according to the present embodiment, in addition to the effect of the first embodiment, noise may be reduced.

Seventh Embodiment

Still another embodiment is described. The present embodiment differs from the first embodiment in the driving method. Thus, only a difference from the first embodiment is described and description of the same configuration as that of the first embodiment is omitted.

Equivalent circuits of the present embodiment are the same as those of the first embodiment. FIG. 1 illustrates equivalent circuits of pixels of the image capturing apparatus of the present embodiment. Description about FIG. 1 is the same as that of the first embodiment and is thus omitted.

A sectional structure of a pixel of the present embodiment is the same as that of the first embodiment. That is, FIG. 2 schematically illustrates a sectional structure of a pixel of the present embodiment. Description about FIG. 2 is the same as that of the first embodiment and is thus omitted.

Figure 13:
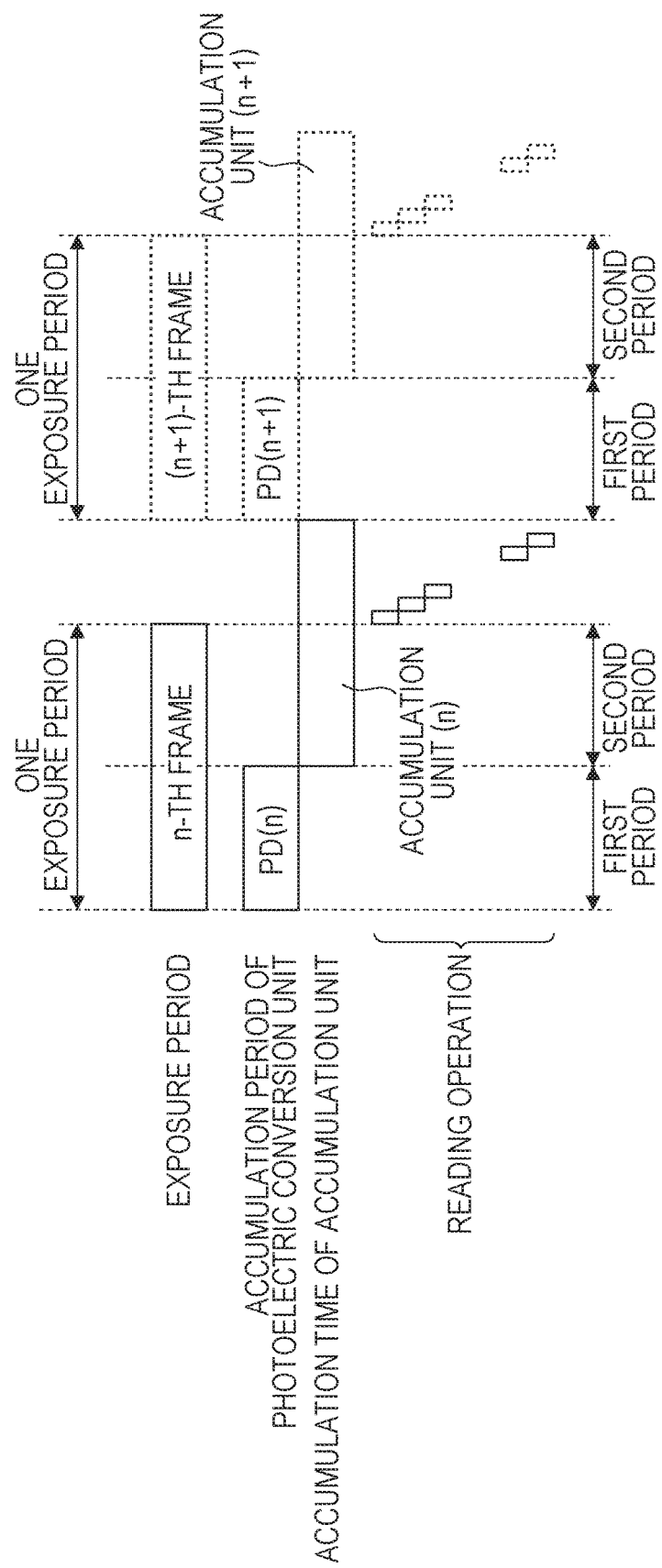
FIG. 13 is a diagram schematically illustrating an operation of an image capturing apparatus.

FIG. 13 schematically illustrates an operation of the image capturing apparatus of the present embodiment. FIG. 13 illustrates an image pickup operation of from the n-th frame to the (n+1)th frame. An operation about the n-th frame is illustrated by a solid line and an operation about the (n+1)th frame is illustrated by a dotted line. FIG. 13 illustrates an exposure period in each frame, a period in which the photoelectric conversion unit 1 accumulates charge, and a period in which the accumulation unit 2 accumulates charge. FIG. 13 further illustrates a reading operation. The reading operation in FIG. 13 is an operation including transfer of charge by the second transfer switch 5 and output of a signal by the amplifier unit 10 which are described with reference to FIGS. 3 and 4. In FIG. 13, the first period and the second period are equal in length.

As illustrated in FIG. 13, a plurality of times of reading operations of pixels are performed after corresponding exposure periods end, that is, after the first period and the second period elapse. No charge is accumulated in a period in which reading operation is performed. In the present embodiment, the exposure period is the sum of the first period and the second period.

In such an operation, it is desirable that a ratio of saturation charge quantity $A_1$ of the photoelectric conversion unit 1 to saturation charge quantity $A_2$ of the accumulation unit 2 is substantially equal to a ratio of the first period P1 to the sum of the first period $P_1$ and a second period $P_2$. That is, it is desirable that $A_1$, $A_2$, $P_1$ and $P_2$ satisfy Expression (5):

$$\frac{P_1 - 0.5 \times P_1}{(P_1 + P_2)} \leq \frac{A_1}{A_2} \leq \frac{P_1 + 0.5 \times P_2}{(P_1 + P_2)}. \quad (5)$$

For example, in the present embodiment, the period in which the photoelectric conversion unit 1 accumulates charge, i.e., the first period, is half the length of one exposure period. Then, saturation charge quantity of the accumulation unit 2 may be about twice as large as saturation charge quantity of the photoelectric conversion unit 1. This is because the charge may overflow in the photoelectric conversion unit 1 even if the accumulation unit 2 has saturation charge quantity greater than that. Therefore, by setting the ratio of saturation charge quantity as expressed by Expression (5), the optimum size of the photoelectric conversion unit 1 and the accumulation unit 2 may be determined.

Eighth Embodiment

Figure 14:
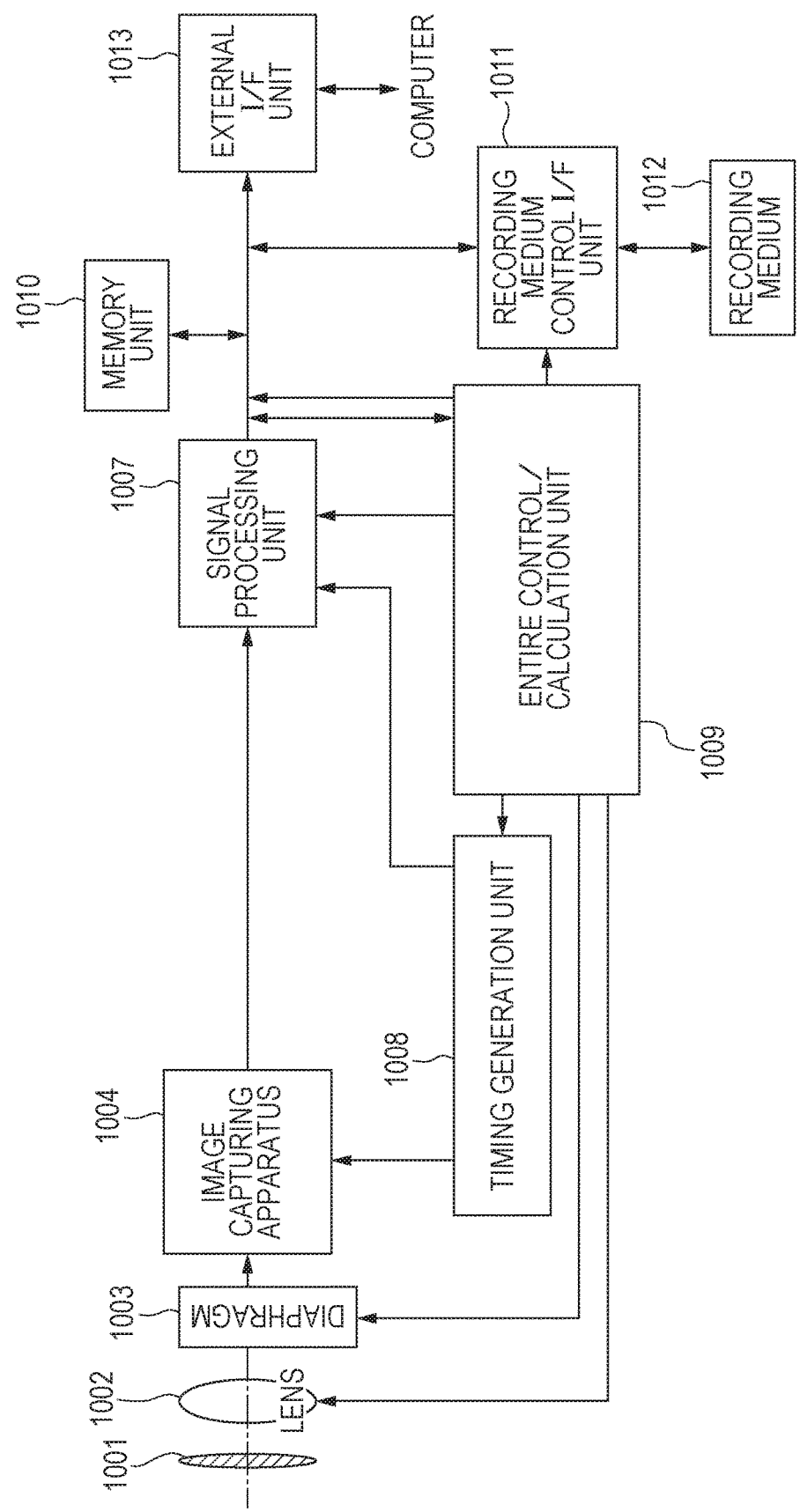
FIG. 14 is a block diagram illustrating a configuration of an image capturing system.

An embodiment of an image capturing system according to the present disclosure is described. Examples of the image capturing system may include a digital still camera, a digital camcorder, a copier, a facsimile machine, a mobile phone, an in-vehicle camera, and an observation satellite. Examples of the image capturing system may also include a camera module provided with an optical system, such as a lens, and an image capturing apparatus. FIG. 14 is a block diagram of a digital still camera as an example of the image capturing system.

In FIG. 14, the reference numeral 1001 denotes a barrier for protecting a lens, the reference numeral 1002 denotes a lens for forming an optical image of a subject on an image capturing apparatus 1004, and the reference numeral 1003 denotes a diaphragm for changing light quantity that has passed through the lens 1002. The reference numeral 1004 denotes the image capturing apparatus described in each of the above embodiments, which converts an optical image formed by the lens 1002 into image data. Here, an AD conversion unit is provided in the semiconductor substrate of the image capturing apparatus 1004. The reference numeral 1007 denotes a signal processing unit that performs various correction and data compression to captured image data output from the image capturing apparatus 1004. In FIG. 14, the reference numeral 1008 denotes a timing generation unit that outputs various timing signals to the image capturing apparatus 1004 and to the signal processing unit 1007, and the reference numeral 1009 denotes an entire control unit that controls the entire digital still camera. The reference numeral 1010 denotes a frame memory unit that temporarily stores the image data, the reference numeral 1011 denotes an interface unit that performs recording or reading to a recording medium, and the reference numeral 1012 denotes a removable recording medium, such as semiconductor memory, in which the captured image data is recorded or from which the imaging data is read. The reference numeral 1013 is an interface unit for communicating with, for example, an external computer. Here, the timing signals or other signals may be input from the outside of the image capturing system, and it is only necessary that the image capturing system is at least provided with the image capturing apparatus 1004, and the signal processing unit 1007 that processes image pickup signals output from the image capturing apparatus 1004.

In the present embodiment, a configuration in which the image capturing apparatus 1004 and the AD conversion unit are formed on the same semiconductor substrate is described. However, the image capturing apparatus 1004 and the AD conversion unit may be provided on different semiconductor substrates. The image capturing apparatus 1004 and the signal processing unit 1007 may be formed on the same semiconductor substrate.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

What is claimed is:

1. An image capturing apparatus, comprising:
a plurality of pixels, each pixel including a photoelectric conversion unit configured to generate charge in response to incident light and accumulate the charge, a holding unit configured to hold the charge, and an amplifier unit configured to output a signal based on the charge; and
an output line to which signals from the plurality of pixels are output,
wherein
at a first time point, the photoelectric conversion units of the plurality of pixels start accumulation of the charge, charges generated in a first period from the first time point to a second time point are accumulated in the photoelectric conversion units of the plurality of pixels accumulate during the first period,
during the first period, the amplifier units of the plurality of pixels output the signals based on charges held by the holding units in turns,
in a second period from the second time point to a third time point, the holding units of the plurality of pixels hold charges generated by the photoelectric conversion units in the first period, and in the second period, the photoelectric conversion units of the plurality of pixel pixels accumulate charges generated by the photoelectric conversion units in the second period,
saturation charge quantity $A_2$ of the holding unit is larger than saturation charge quantity $A_1$ of the photoelectric conversion unit.

2. The image capturing apparatus according to claim 1, wherein
each of the plurality of pixels includes a discharge switch configured to discharge the charge in the photoelectric conversion unit; and
from the first time point to the second time point, the discharge switch of at least one of the plurality of pixels is kept OFF.

3. The image capturing apparatus according to claim 2, wherein the accumulation of the charge is started by controlling the discharge switch from ON to OFF.

4. The image capturing apparatus according to claim 1, wherein each of the plurality of pixels includes:
a first transfer switch configured to transfer the charge to the holding unit from the photoelectric conversion unit; and
a second transfer switch configured to transfer the charge to the amplifier unit from the holding unit.

5. The image capturing apparatus according to claim 4, wherein the accumulation of the charge is started by controlling the first transfer switch from ON to OFF.

6. The image capturing apparatus according to claim 4, wherein:
the first transfer switches of the plurality of pixels are turned ON by the second time point at the latest; and
in a part of the second period, the first transfer switches are turned OFF.

7. The image capturing apparatus according to claim 6, wherein, in the second period, the first transfer switches are controlled from OFF to ON a plurality of times.

8. The image capturing apparatus according to claim 7, wherein the plurality of times is greater than a ratio of saturation charge quantity of the holding unit to saturation charge quantity of the photoelectric conversion unit.

9. The image capturing apparatus according to claim 8, wherein the holding unit includes a first semiconductor region of first conductivity type in which the charge is accumulated.

10. The image capturing apparatus according to claim 9, wherein the holding unit includes a second semiconductor region of second conductivity type disposed on the first semiconductor region.

11. The image capturing apparatus according to claim 10, wherein:
the holding unit includes a third semiconductor region of second conductivity type disposed below the first semiconductor region, and a fourth semiconductor region of second conductivity type disposed below the third semiconductor region; and
impurity concentration of the third semiconductor region is higher than impurity concentration of the fourth semiconductor region.

12. The image capturing apparatus according to claim 1, further comprising a waveguide disposed to correspond to each of the photoelectric conversion units of the plurality of pixels.

13. The image capturing apparatus according to claim 1, wherein, in the first period, the second transfer switches of the plurality of pixels are turned ON in turns, and the amplifier units of the plurality of pixels output the signals to the output line in turns.

14. An image capturing apparatus according to claim 1, comprising:
wherein
the saturation charge quantity $A_1$ of the photoelectric conversion unit, the saturation charge quantity $A_2$ of the unit, the first period $P_1$, and the second period $P_2$ satisfy the following relationship:

$$\frac{P_1 - 0.5 \times P_1}{(P_1 + P_2)} \le \frac{A_1}{A_2} \le \frac{P_1 + 0.5 \times P_2}{(P_1 + P_2)}.$$

15. The image capturing apparatus according to claim 14, wherein the saturation charges quantity $A_1$ of the photoelectric conversion unit, the saturation charge quantity $A_2$ of the holding unit, the first period $P_1$, and the second period $P_2$ satisfy the following relationship:

$$\frac{A_1}{A_2} = \frac{P_1}{(P_1 + P_2)}.$$

16. The image capturing apparatus according to claim 14, wherein the saturation charge quantity $A_1$ of the photoelectric conversion unit, the saturation charge quantity $A_2$ of the holding unit, the first period $P_1$, and the second period $P_2$ satisfy the following relationship:

$$\frac{P_1 - 0.5 \times P_1}{(P_1 + P_2)} \le \frac{A_1}{A_2} < \frac{P_1}{(P_1 + P_2)}. \quad (3)$$

17. The image capturing apparatus according to claim 1, wherein saturation charge quantity $A_1$ of the photoelectric conversion unit, saturation charge quantity $A_2$ of the holding unit, the first period $P_1$, and the second period $P_2$ satisfy the following relationship:

$$\frac{P_1}{(P_1 + P_2)} < \frac{A_1}{A_2} \le \frac{P_1 + 0.5 \times P_2}{(P_1 + P_2)}. \quad (4)$$

18. The image capturing system, comprising:
the image capturing apparatus according to claim 1; and
a signal processing apparatus configured to process a signal from the image capturing apparatus.

19. The image capturing apparatus according to claim 1, wherein the second period is longer than the first period.

20. The image capturing apparatus according to claim 1, wherein, during the first period, the amplifier units of the pixels of a first row through the pixels of the last row of a single frame output the signals based on charges held by the holding units in turns.

21. The image capturing apparatus according to claim 1, wherein, during the first period, the amplifier units of the plurality of pixels output in the signals based on charges held by the holding units and generated in an exposure for a previous frame.

* * * * *